(12) United States Patent
Wang et al.

(10) Patent No.: US 10,958,893 B2
(45) Date of Patent: Mar. 23, 2021

(54) VCSEL ARRAY LIGHT SOURCE

(71) Applicant: ORBBEC INC., Guangdong (CN)

(72) Inventors: Zhaomin Wang, Guangdong (CN); Min Yan, Guangdong (CN); Xing Xu, Guangdong (CN); Xu Chen, Guangdong (CN)

(73) Assignee: Orbbec Inc., Guangdong (CN)

( * ) Notice: Subject to any disclaimer, the term of this patent is extended or adjusted under 35 U.S.C. 154(b) by 0 days.

(21) Appl. No.: 16/415,307

(22) Filed: May 17, 2019

(65) Prior Publication Data

US 2019/0273905 A1  Sep. 5, 2019

Related U.S. Application Data

(63) Continuation of application No. PCT/CN2018/071986, filed on Jan. 9, 2018.

(30) Foreign Application Priority Data

May 15, 2017  (CN) .......................... 201710340137.5

(51) Int. Cl.
*H04N 13/254* (2018.01)
*G02B 27/48* (2006.01)
(Continued)

(52) U.S. Cl.
CPC ........... *H04N 13/254* (2018.05); *G02B 27/48* (2013.01); *G02B 30/00* (2020.01);
(Continued)

(58) Field of Classification Search
CPC ... H04N 13/254; H01S 5/04256; H01S 5/423; H01S 5/005; G02B 30/00; G02B 27/48; G02B 21/2013; G02B 21/2033
(Continued)

(56) References Cited

U.S. PATENT DOCUMENTS

2015/0072258 A1 * 3/2015 Naito .................. H01M 8/0267
429/434
2015/0316368 A1   11/2015 Moench et al.
(Continued)

FOREIGN PATENT DOCUMENTS

CN   102494609 A   6/2012
CN   102683337 A   9/2012
(Continued)

OTHER PUBLICATIONS

PCT International Search Report and the Written Opinion dated Mar. 23, 2018, issued in related International Application No. PCT/CN2018/071986 (13 pages).
(Continued)

*Primary Examiner* — Michael Lee
(74) *Attorney, Agent, or Firm* — Sheppard Mullin Richter & Hampton LLP

(57) ABSTRACT

The present disclosure discloses a VCSEL array light source, a pattern design method for the VCSEL array light source, a laser projection apparatus, and a three-dimensional (3D) imaging device. The VCSEL array light source includes a semiconductor substrate and a plurality of VCSEL light sources arranged on the semiconductor substrate in a two-dimensional array. The two-dimensional array includes at least one sub-array and is generated by transforming the at least one sub-array.

12 Claims, 5 Drawing Sheets

(51) Int. Cl.
    *H01S 5/42*     (2006.01)
    *G03B 21/20*     (2006.01)
    *H01S 5/042*     (2006.01)
    *G02B 30/00*     (2020.01)
    *H01S 5/00*     (2006.01)

(52) U.S. Cl.
    CPC ..... *G03B 21/2013* (2013.01); *G03B 21/2033* (2013.01); *H01S 5/04256* (2019.08); *H01S 5/423* (2013.01); *H01S 5/005* (2013.01)

(58) Field of Classification Search
    USPC .......................................................... 348/162
    See application file for complete search history.

(56) References Cited

U.S. PATENT DOCUMENTS

| | | | |
|---|---|---|---|
| 2015/0355470 A1* | 12/2015 | Herschbach | G03B 15/06 362/11 |
| 2015/0362585 A1* | 12/2015 | Ghosh | G01S 7/4815 250/208.1 |
| 2016/0025993 A1 | 1/2016 | Mor et al. | |
| 2016/0127714 A1 | 5/2016 | Hazeghi et al. | |
| 2016/0182891 A1* | 6/2016 | Ko | H04N 5/2257 348/47 |

FOREIGN PATENT DOCUMENTS

| | | | |
|---|---|---|---|
| CN | 104798271 | A | 7/2015 |
| CN | 105319811 | A | 2/2016 |
| CN | 106406002 | A | 2/2017 |
| CN | 106568396 | A | 4/2017 |
| CN | 106972347 | A | 7/2017 |
| CN | 107026392 | A | 8/2017 |
| CN | 107039885 | A | 8/2017 |
| CN | 107424188 | A | 12/2017 |
| CN | 206908092 | U | 1/2018 |
| WO | 2016122404 | A1 | 8/2016 |

OTHER PUBLICATIONS

First Search dated Nov. 27, 2019, issued in related Chinese Application No. 201710340137.5 (2 pages).
First Office Action dated Dec. 5, 2019, issued in related Chinese Application No. 201710340137.5, with English machine translation (10 pages).
Second Office Action dated Mar. 19, 2020, issued in related Chinese Application No. 201710340137.5, with English machine translation (17 pages).
PCT International Preliminary Report on Patentability dated Nov. 28, 2019, issued in related International Application No. PCT/CN2018/071986, with English machine translation (14 pages).
Third Office Action dated Jun. 23, 2020, issued in related Chinese Application No. 201710340137.5, with English machine translation (8 pages).
Supplemental Search dated Jul. 13, 2020, issued in related Chinese Application No. 201710340137.5 (1 page).
Fourth Office Action dated Jul. 23, 2020, issued in related Chinese Application No. 201710340137.5, with English machine translation (14 pages).

* cited by examiner

VCSEL ARRAY LIGHT SOURCE

CROSS-REFERENCE TO RELATED APPLICATIONS

This is a continuation of International Application No. PCT/CN2018/071986, filed on Jan. 9, 2018, which is based on and claims priority to and benefits of Chinese Patent Application No. 201710340137.5, filed with the State Intellectual Property Office (SIPO) of the People's Republic of China on May 15, 2017. The entire contents of all of the above-identified applications are incorporated herein by reference.

TECHNICAL FIELD

The present disclosure relates to the field of optics and electronic technologies, and in particular, to a Vertical-Cavity Surface-Emitting Laser (VCSEL) array including a plurality of sub-arrays.

BACKGROUND

Three-dimensional (3D) imaging, especially the 3D imaging technology applied to the field of consumptions, continually impacts or even replaces the conventional two-dimensional (2D) imaging technology. In addition to the capability of 2D imaging on target objects, the 3D imaging technology can obtain depth information of the target objects. Functions, such as 3D scanning, scene modeling, and gesture interaction, can be further implemented based on the depth information. Depth cameras, especially structured light depth cameras or time of flight (TOF) depth cameras, are common hardware devices used for 3D imaging.

The core component in the depth camera is a laser projection module. The structure and function of the laser projection module vary with respect to the type of the depth camera. For example, the projection module disclosed in the patent CN201610977172A is configured to project speckle (spots & dots) patterns into the space to implement structured light depth measurement. Such a speckle structured light depth camera is also a relatively mature and widely adopted solution, currently. With the continuous expanding of the application fields of the depth cameras, optical projection modules will be more miniaturized and have better performance.

Featuring a small size, high power, concentrated beam, and other advantages, a depth camera using a vertical cavity surface emitting laser (VCSEL) array light source will replace an edge-emitting laser emitter light source. The VCSEL array is characterized by arranging a plurality of VCSEL light sources on an extremely small substrate for laser projection, for example, arranging 100 or more VCSEL light sources on a 2 mm×2 mm semiconductor substrate. For a structured light depth camera, the speckle patterns projected by the laser projection module require extremely high irrelevance, which increases the design difficulty of the light source arrangement in the VCSEL array.

SUMMARY

To solve the problem of low irrelevance of VCSEL light sources for 3D imaging, the present disclosure provides a VCSEL array light source.

The technical problem of the present disclosure is solved by the following technical solutions, including a VCSEL array light source, a pattern design method for the VCSEL array light source, a laser projection apparatus, and a 3D imaging device.

A VCSEL array light source provided in the present disclosure includes: a semiconductor substrate; and a plurality of VCSEL light sources arranged on the semiconductor substrate in the form of a two-dimensional array. The two-dimensional array is generated by transforming at least one sub-array. The sub-array is distributed within a regular region and/or an irregular region. The regular region further includes a polygonal region or a circular region. The transformation includes one or a combination of translation, rotation, mirroring, and scaling. There are one or more situations between two adjacent sub-arrays constituting the two-dimensional array: partially overlapping with each other, existence of a spacing region without a VCSEL light source, and edge overlapping. When there are at least two sub-arrays, the sub-arrays are different in at least one of the size, the distribution shape, and the number of light sources. In the detailed embodiments, the VCSEL light sources in the sub-array are arranged on the semiconductor substrate in an irregular two-dimensional pattern. In addition, the semiconductor substrate includes a plurality of sub-substrates, and the sub-arrays of the VCSEL light sources are correspondingly arranged on the sub-substrates.

Similarly, further included in the present disclosure is a VCSEL array light source including: a semiconductor substrate; and a plurality of VCSEL light sources arranged on the semiconductor substrate in the form of a two-dimensional array. The two-dimensional array includes at least two sub-arrays, and the sub-arrays are different in at least one of the size, the distribution shape, and the number of light sources.

In addition, the present disclosure provides a pattern design method for a VCSEL array light source including: generating an irregularly arranged sub-array pattern; and transforming the sub-array pattern to obtain a pattern of a two-dimensional array.

Moreover, the present disclosure provides a laser projection apparatus including: any of the above mentioned VCSEL array light source; at least one lens, configured to receive and converge a light beam emitted from the VCSEL array light source; and a speckle pattern generator, configured to expand the light beam to emit a speckle pattern beam into the space; where the lens is one or a combination of a single lens and a microlens array; and the speckle pattern generator is one or a combination of a microlens array, a diffractive optical element (DOE), and a grating.

In addition, the present disclosure provides a 3D imaging device including: the laser projection apparatus, configured to emit a structured light pattern beam into the space; an image acquisition apparatus, configured to collect a structured light image formed by irradiating the structured light pattern beam on a target object; and a processor, configured to receive the structured light image and calculate a depth image of the target object according to a trigonometric principle.

The trigonometric principle refers to calculating the deviation value between the structured light image and a reference image by using a matching algorithm, and calculating the depth image based on the deviation value.

Compared with the prior art, the present disclosure has the following benefits: A plurality of VCSEL light sources is arranged on the semiconductor substrate in the form of a two-dimensional array, wherein the arrangement of the two-dimensional array is generated by transforming at least one sub-array. The irrelevance of sub-regions in any direction of the arrangement of the two-dimensional array are obtained by simply transforming the sub-array, and the two-dimensional array corresponds to the distribution of VCSEL light sources, so the VCSEL light sources distributed on the surface of the semiconductor substrate have extremely high irrelevance.

DESCRIPTION OF EMBODIMENTS

The present disclosure is further described with reference to the accompanying drawings in combination with some preferred embodiments.

The present disclosure provides a VCSEL array including a plurality of sub-arrays. The VCSEL array can be used as a light source of a laser projection apparatus in 3D imaging devices. Concurrently, corresponding laser projection apparatus and 3D imaging devices are provided based on the laser array, and the 3D imaging device here is also called a depth camera. A value on each pixel in the image of an object captured by the depth camera represents a depth value between a corresponding point in the space and the depth camera. In the following description, a laser array, a laser projection apparatus, and a depth camera will be taken as examples, which does not mean that such a laser array can be applied only in a depth camera. Any other apparatuses directly or indirectly using the technical solutions of the present disclosure should all be included in the protection scope of the present disclosure.

Figure 1:
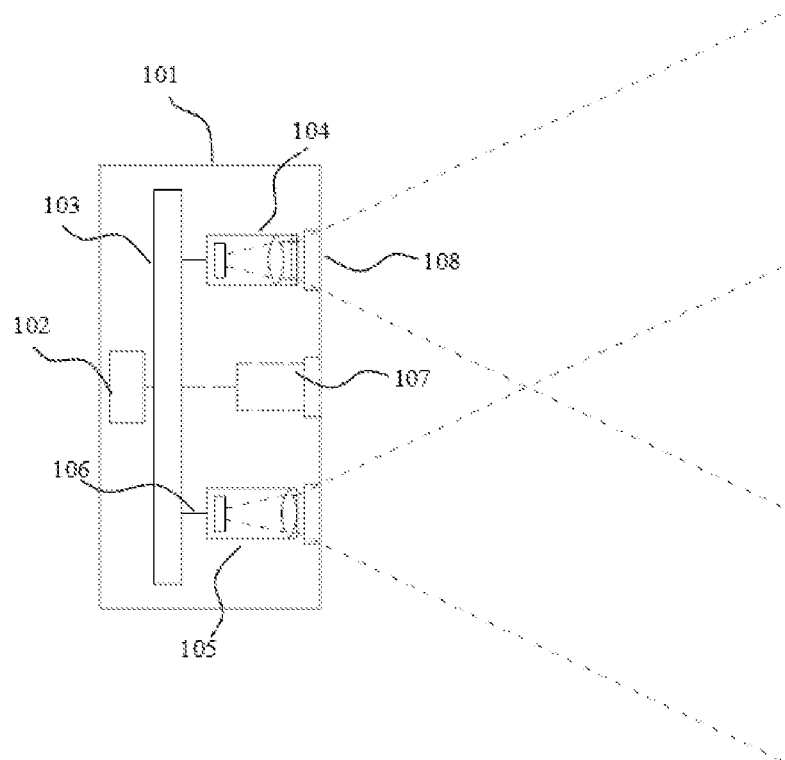
FIG. 1 is a side view of a structured light depth camera system according to concrete embodiments of the present disclosure.

FIG. 1 shows a schematic side view of a structured light based depth camera. The main components of the depth camera (3D imaging device) 101 include a laser projection module (equivalent to a laser projection apparatus) 104, an acquisition module (equivalent to an image acquisition apparatus) 105, a main board 103, and a processor 102. Some depth cameras are further equipped with a Red, Green and Blue (RGB) camera 107. The laser projection module 104, the acquisition module 105, and the RGB camera 107 are usually mounted on the same depth camera plane and located at the same baseline, and each module or camera corresponds to one of the light inlet windows 108. Generally, the processor 102 is integrated on the main board 103, and the laser projection module 104 and the acquisition module 105 are connected to the main board through an interface 106. In one embodiment, the interface is a Flexible Printed Circuit (FPC) interface. The main board can be a circuit board including a circuit, a semiconductor substrate, or a bracket for supporting and dissipating heat, etc. The laser projection module is configured to project an encoded structured light pattern into target space, and the acquisition module collects a structured light image and processes it through the processor to obtain a depth image of the target space. In one embodiment, the structured light image is an infrared laser speckle pattern, and the pattern has relatively uniform particle distribution but high local irrelevance. The local irrelevance means that each sub-region of a pattern in a certain direction (generally refers to the direction along which the laser projection module and the acquisition module are connected) has a high degree of uniqueness. The corresponding acquisition module 105 is an infrared camera corresponding to the laser projection module 104. The depth image is obtained by the processor is specifically referred to the depth image obtained by calculating the deviation value between the speckle pattern and a reference speckle pattern, after receiving the speckle pattern collected by the acquisition module.

Figure 2:
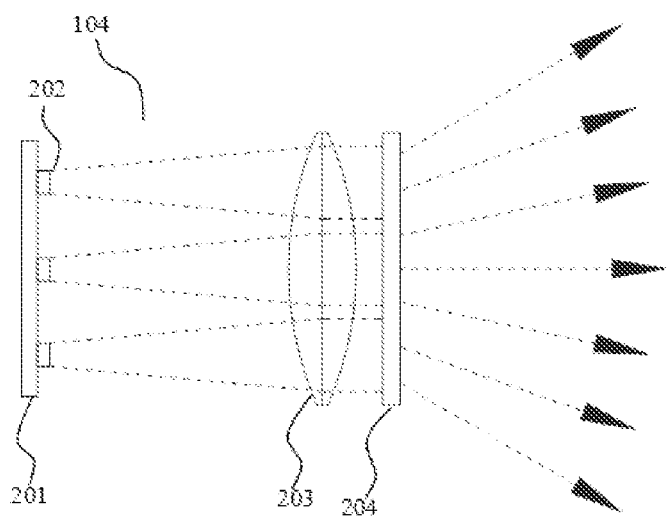
FIG. 2 is a side view of a laser projection apparatus according to concrete embodiments of the present disclosure.

FIG. 2 is an embodiment of the laser projection module 104 of FIG. 1. The laser projection module 104 includes a substrate 201, a light source 202, a lens 203, and a speckle pattern generator 204. The substrate 201 is generally a semiconductor substrate, such as a wafer, on which a plurality of light sources 202 are arranged. The substrate 201 and the light source 202 together form a laser array, such as a VCSEL array chip. The light source 202 includes a plurality of sub-light sources configured to emit a plurality of sub-beams. The light source can be visible light, invisible light such as infrared light or ultraviolet light source, and other laser sources. The light source can be an edge emitting laser or a VCSEL. To make the overall projection apparatus smaller, one of the optimal solutions is to select a VCSEL array as the light source, and also has an advantage of small light source divergence angle. In addition, different types of VCSELs can also be arranged on the same substrate, for example, the shapes, sizes, and brightness of the VCSELs can be different. In the figures, for ease of illustration, only three sub-light sources are listed in one dimension. Actually, the VCSEL array are two-dimensional light sources arranged in a fixed two-dimensional pattern. The VCSEL array chip can be either a bare die or a packaged chip, but the difference is that the bare die has a smaller size and thickness, while the packaged chip has better stability and can be more easily connected.

To make the pattern emitted by the laser projection apparatus have uniform, irrelevant and other characteristics, the arrangement pattern of the light sources on the VCSEL array chip should be irregular, that is, the light sources should be arranged in an irregular array. In some embodiments, the overall size of the VCSEL array chip is only on the order of millimeters (mm), such as 2 mm×2 mm, with tens or even hundreds of light sources arranged thereon, and the distances among the light sources are on the order of microns (µm), such as 30 µm.

The lens 203 is configured to receive light beams emitted from the VCSEL array light source 202 and converge them. In one embodiment, diverged VCSEL light beams are collimated into parallel beams to ensure that the emitted speckle energy is more concentrated. In addition to a single lens, a microlens array (MLA) can be also used in another embodiment. Each microlens unit in the MLA corresponds to one light source 202, or corresponds to a plurality of light sources 202. In another embodiment, a lens group can also be used to achieve beam convergence.

The speckle pattern generator 204 is configured to receive the lens beam and emit a light beam capable of forming a speckle pattern. In one embodiment, the speckle pattern generator 204 is a diffractive optical element (DOE), which acts as a beam splitter. For example, when the number of light sources 202 is 100, 100 light beams will be transmitted to the DOE via the lens. Then the DOE can expand the lens beams at a certain number of multiples (for example, 200), and eventually emit 20,000 light beams into the space. Ideally, 20,000 speckles can be seen (in some cases, speckle overlapping can occur, resulting in a decrease in the number of speckles). In addition to the DOE, any other optical elements that can form speckles, such as a MLA, a grating, or a combination of optical elements, can be used.

In some embodiments, the lens 203 and the speckle pattern generator 204 can be manufactured on the same optical element to reduce the size.

FIG. 3 to FIG. 9 are schematic diagrams of light source arrangements of a VCSEL array according to an embodiment of the present disclosure. In each figure, a circle or a plus sign indicates the location of the light source, not the actual shape and size of the light source. The double lined box represents the outline of the substrate. To facilitate the description of the concepts in the present disclosure, some dashed lines are added to the figures as separate or auxiliary lines, which are only used for illustration, not really existed in the VCSEL array.

For the depth cameras based on structured light, especially the speckled patterns of structured light, the key step in measuring the depth by triangulation is to calculate the pixel deviation value between the speckle image and a reference speckle pattern. This calculation step is performed by a depth processor (or a dedicated processing chip), and an important step in the calculation is to search for a common sub-region in the speckle image and the reference speckle image according to a matching algorithm. The sub-region refers to a fixed-size pixel region in the image, such as 7×7 pixels or 11×11 pixels. The matching algorithm requires that patterns within sub-regions in the speckle image are different along the baseline direction, that is, the speckle image is required to have high local irrelevance. The baseline refers to a connecting line between the laser projection module 104 and the acquisition module 105.

To meet the requirement of local irrelevance, generally, the light sources 202 in the VCSEL array need to be arranged irregularly. A common design solution is to randomly generate the location information of the light sources 202 on the substrate 201. The advantages of this solution are that the design idea is clear, and the design is relatively simple to implement. However, the disadvantage is that the arrangement pattern of the light sources 202 is hard to control, which leads to a lot of experiments and verifications for generating a relatively superior irrelevant pattern. In addition, it is difficult to ensure the positioning accuracy of each speckle in the chip manufacturing process. VCSEL chips with regular arrangements or symmetrical characteristics tend to be superior in precision, efficiency, etc. during production.

Figure 3:
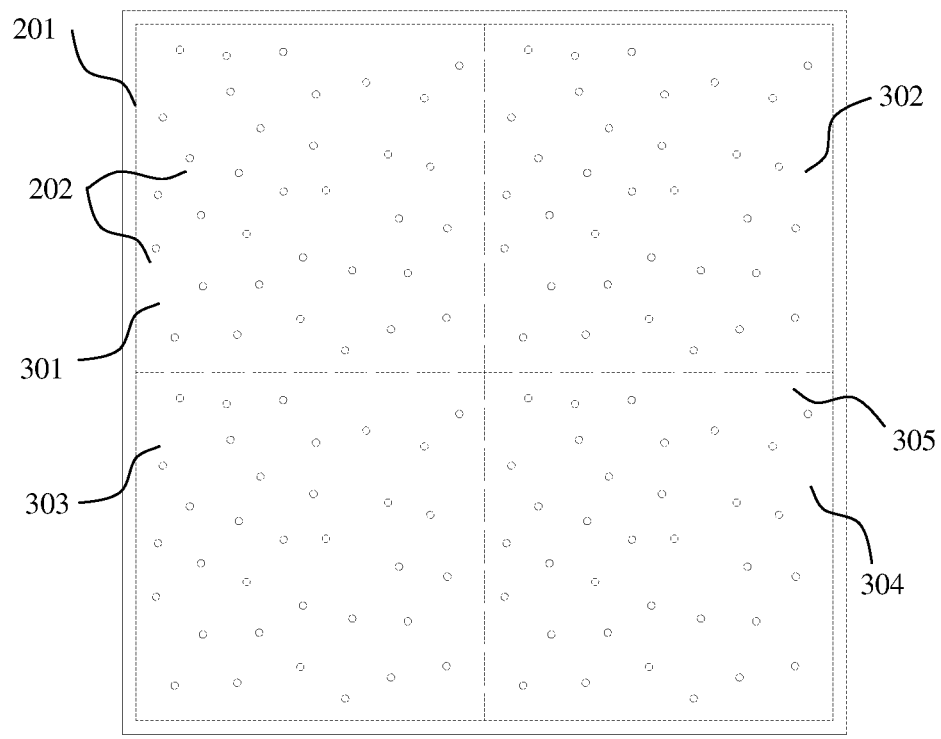
FIG. 3 is a schematic diagram of a VCSEL array according to an embodiment of the present disclosure.

The design solution adopted in the present disclosure can solve the foregoing disadvantages or problems. In FIG. 3, a plurality of light sources 202 is arranged on the substrate 201 to form a two-dimensional pattern array. According to characteristics of the pattern array, the pattern array can be divided into four sub-arrays 301, 302, 303, and 304, which are separated by a dashed line 305 in FIG. 3. Light sources in the sub-array 301 are irregularly arranged on the substrate and have high irrelevance. Light source arrangement patterns in the sub-arrays 302, 303, and 304 are the same as that in the sub-array 301. Therefore, it can be considered that the sub-array is used to form the other three sub-arrays by means of translation, and finally, the four sub-arrays together form a VCSEL light source array. In particular, the sub-array 302 can be considered as being formed by horizontally translating the sub-array 301 until the boundaries of the two sub-arrays coincide. The sub-array 303 can be considered as being formed by vertically translating the sub-array 301, and the sub-array 304 can be considered as being formed by obliquely translating the sub-array 301 at 45 degrees clockwise. Due to the irrelevance of the sub-array 301, the overall VCSEL array is irrelevant on each sub-array, but adjacent sub-arrays are highly relevant. The irrelevance of the resulted structured light pattern of the two-dimensional pattern is lower, and several superior VCSEL array arrangement solutions will be presented in the following embodiments.

For the VCSEL array shown in FIG. 3, only one sub-array pattern needs to be generated in design, and the overall VCSEL array pattern can be quickly generated by translation of the one sub-array pattern. In addition, the sub-arrays 303 and 304 in FIG. 3 can also be considered as being formed by translating the sub-array 302. However, because the sub-array 302 is formed by the sub-array 301, the overall VCSEL array is essentially formed by translating the one sub-array 301.

Figure 4:
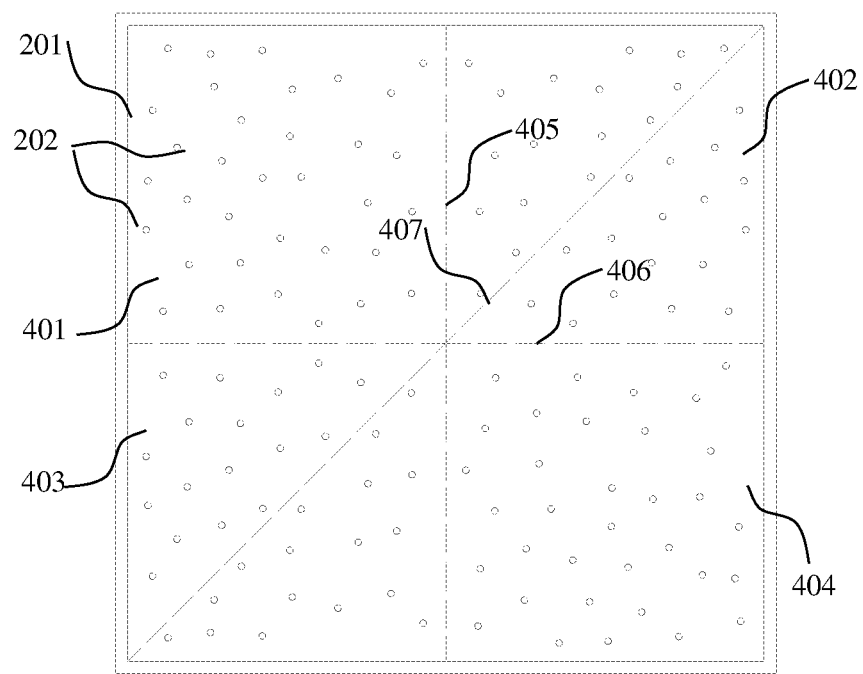
FIG. 4 is a schematic diagram of a VCSEL array according to an embodiment of the present disclosure.

In another embodiment of the VCSEL array shown in FIG. 4, the VCSEL array includes four sub-arrays 401, 402, 403, and 404. The sub-array 402 is formed by mirroring the sub-array 401 along the right side line (dashed line 405). The sub-array 403 is formed by mirroring the sub-array 401 along the lower side line (dashed line 406), and the sub-array 404 is formed by mirroring the sub-array 401 along a dashed line 407.

Figure 5:
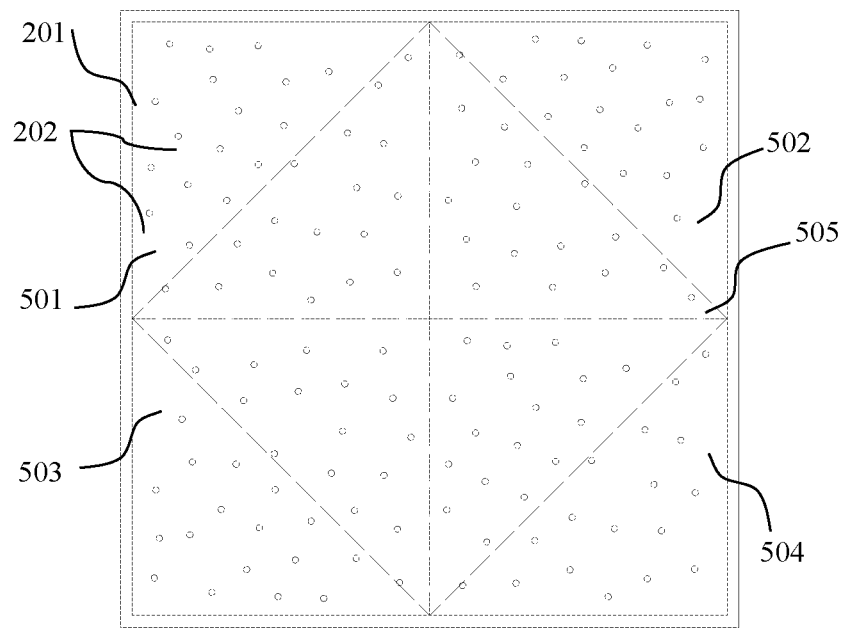
FIG. 5 is a schematic diagram of a VCSEL array according to an embodiment of the present disclosure.

In another embodiment of the VCSEL array shown in FIG. 5, the VCSEL array also includes four sub-arrays 501, 502, 503, and 504. The sub-array 502 is formed by rotating the sub-array 501 along its geometric center by 90 degrees clockwise and then translating, or can be formed by rotating the sub-array 501 along the lower right corner by 90 degrees clockwise. In FIG. 5, a dashed line is added to each sub-array to clearly indicate the relative direction between the sub-arrays. Similarly, the sub-arrays 503 and 504 can be formed by rotating and/or translating the sub-array 501.

Figure 6:
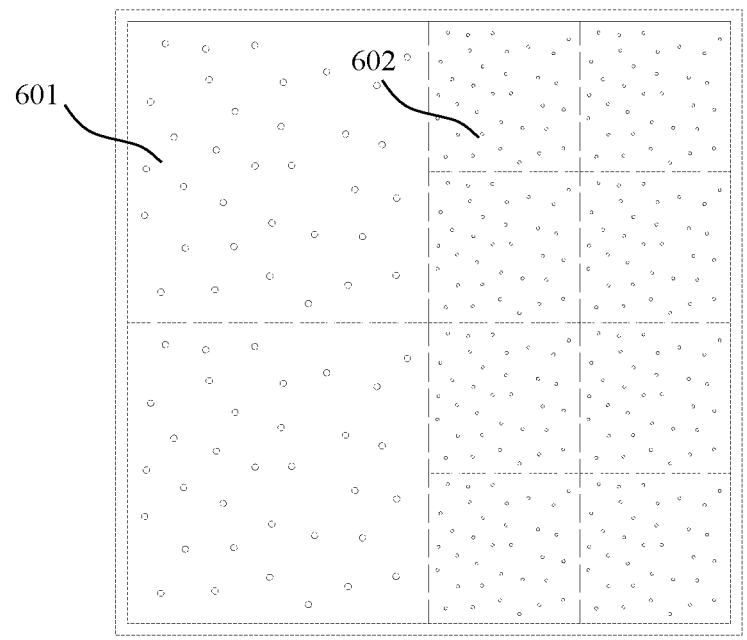
FIG. 6 is a schematic diagram of a VCSEL array according to an embodiment of the present disclosure.

FIG. 6 is another embodiment of the VCSEL array. The difference is that the sub-array 602 is formed by reducing the size of a sub-array 601 to a quarter of the original size in horizontal and vertical directions. In other embodiments, a sub-array can also be scaled up or down (collectively called scaling) by different multiples in different directions (such as in the horizontal x direction and/or the vertical y direction) to obtain different sub-arrays. As such, the arrangement density of light sources in the sub-array 602 is higher than that of the sub-array 601. The other sub-arrays are all formed by translating and/or scaling the sub-array 601. The arrangement densities of the light sources in the VCSEL array are different, and the advantage is that VCSEL light sources of different densities can be grouped for control respectively, so structured light patterns of different densities can be formed for different application scenarios.

Figure 7:
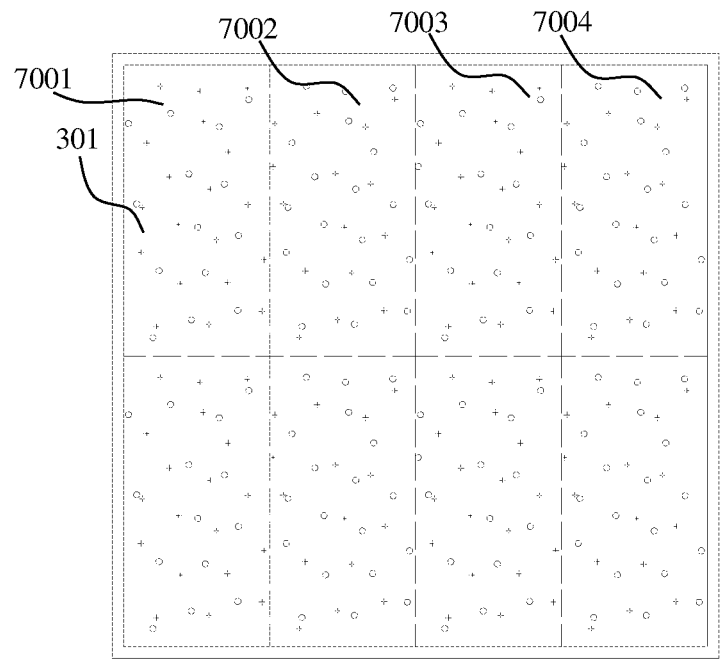
FIG. 7 is a schematic diagram of a VCSEL array according to an embodiment of the present disclosure.

FIG. 7 is a schematic diagram of another embodiment of the present disclosure. The VCSEL array is formed by translating a sub-array 301. Different from the previous embodiments, the translated sub-array overlaps the original sub-array. In this embodiment, the overlapped region is half of the overall sub-array region. For example, the region 7001 in the figure is formed by translating the sub-array 301 leftward by a certain distance, which is half of the bottom width of the sub-array 301. A region 7002 is formed by translating the sub-array 301 rightward by the distance. In other words, the regions 7001, 7002, 7003, and 7004 and the two-dimensional array of the marked region in the figure are formed by combining the left half array and the right half array of the sub-array 301. This translation can increase the density of the array pattern. Generally, the smaller translation distance, the greater the density.

Figure 8:
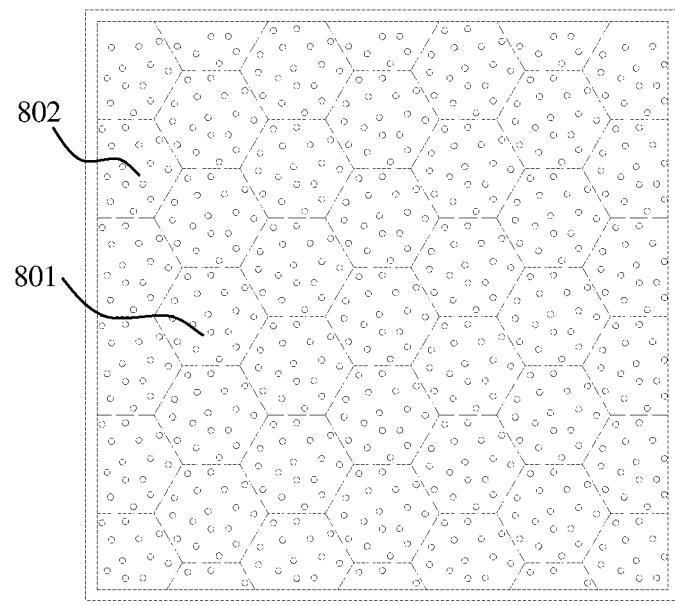
FIG. 8 is a schematic diagram of a VCSEL array according to an embodiment of the present disclosure.

FIG. 8 is a schematic diagram of another embodiment of the present disclosure. The VCSEL array is formed by translating (translating up and down, translating obliquely) a sub-array 801. The shape of the sub-array 801 is a regular hexagon. It should be noted that if the overall VCSEL array is a square, sub-arrays of its edge regions are only a part of the sub-array 801, such as the sub-array 802.

Figure 9:
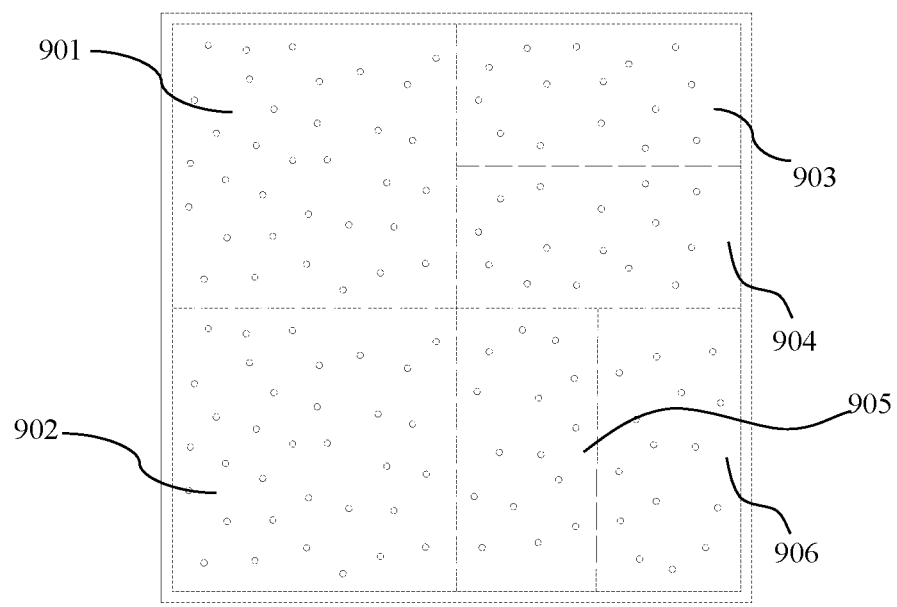
FIG. 9 is a schematic diagram of a VCSEL array according to an embodiment of the present disclosure.

FIG. 9 is a schematic diagram of another embodiment of the present disclosure. Different from the previous embodiments, there are two sub-arrays, i.e., the sub-array 901 and the sub-array 903. For other sub-arrays in the VCSEL array, the sub-array 902 is formed by translating the sub-array 901, the sub-array 904 is formed by mirroring the sub-array 903, the sub-array 905 is formed by rotating the sub-array 903 by 90 degrees clockwise and then translating, and the sub-array 906 is formed by rotating the sub-array 903 by 90 degrees counterclockwise and then translating.

The number of sub-arrays for generating a two-dimensional array through transformation is 1 or 2 in the previous embodiments, but not limited to the above described embodiments, and there can be other numbers of sub-arrays. When the number of sub-arrays is not less than 2, the sub-arrays are different in at least one aspect of the size, the distribution shape, and the number of light sources, and these sub-arrays are used to generate a two-dimensional array of high irrelevance through transformation.

In addition, according to another embodiment of the present disclosure, a plurality of different sub-arrays can be combined to form a two-dimensional array. The differences described here can take many forms, for example, the overall shape, distribution shape, and size of the sub-arrays, or the distribution, shape, number, and the light-emitting characteristics such as wavelength of the light sources. In this way, a plurality of different application scenarios can be implemented by group control or overall control to different sub-arrays.

The previous embodiments are illustrative examples that are exemplified according to the concepts of the present disclosure and do not fully represent all of the inventive concepts. In the VCSEL array, more sub-arrays can be formed by one or more sub-arrays at different transformation modes, then, these sub-arrays together form the VCSEL array. In addition to the translation, rotation, scaling, and mirroring described in the previous embodiments, the transformation can be in other forms, such as one-way stretching or compression. In the same VCSEL array, multiple transformation modes are allowed. The same VCSEL array includes a plurality of sub-arrays, and the sub-arrays have at least one or more relationships of translation, rotation, mirroring, and scaling. In addition, the sub-arrays can be partially overlapped, but in general, the overlapped region should be no more than half of the region. Moreover, a spacing region without a VCSEL light source or edge overlap can also exist between the sub-arrays. So any one or more of the three situations described above can exist among the sub-arrays. Apparently, an increase in the types of transformations will contribute to the overall irrelevance improvement of the VCSEL array.

The shape of the sub-array and the arrangement and number of internal VCSEL light sources are some key factors affecting the final quality of the VCSEL array. The shape of the sub-array is usually a regular shape, such as a polygonal shape like a square or a hexagon, or a circular shape, or other irregular shapes. The number of sub-arrays is not limited to the number in the embodiments provided in the present disclosure, and there can be various forms of transformations. For example, the number of sub-arrays in a square two-dimensional array can be $n^2$ (n is an integer greater than or equal to 2), or other numbers such as 8 and 12.

It should be noted that the shape described here is an abstract generalization of the arrangement of VCSEL light sources in the sub-arrays. The shape is generally not visible in the VCSEL array, that is, the dashed lines are generally not marked in the VCSEL array. Besides, any shapes of the pattern arrangement of the VCSEL array that conform to the concept of the present disclosure should be included within the protection scope of the present disclosure.

In addition, the substrate 201 in the present disclosure is a single substrate by default. In some embodiments, a plurality of substrates can also be used. In one embodiment, a pattern of one sub-array is independently formed on each substrate. The advantage of this mode is that by manufacturing one or more sub-arrays, a VCSEL array light source with higher irrelevance can be produced by physically splicing the sub-arrays obtained through transformation such as rotation and/or translation.

In the present disclosure, a plurality of sub-arrays is formed by transforming one or more sub-arrays, and the plurality of sub-arrays together forms a VCSEL array light source, thereby ensuring that the arrangement of the VCSEL array light sources is easily implemented and ensuring high irrelevance. Moreover, because of the transformation of only a few sub-arrays, the manufacturing difficulty of the VCSEL array chips is greatly reduced, so that the manufacturing efficiency and quality are improved.

In the present disclosure, the arrangement patterns of the light sources in the VCSEL chip in the embodiments shown in FIG. 3 to FIG. 9 should be understood as descriptions of similar patterns, and a design method for generating the patterns is correspondingly provided: firstly, one or more sub-arrays are generated, and then the sub-arrays are transformed to finally generate an entire pattern (i.e., a two-dimensional array pattern). It is not excluded that there are other design methods to achieve the equivalent effect as using the sub-array transformation and to generate a pattern having the same characteristics by the transformation. It can be understood that the VCSEL pattern, having the equivalent effect as transformation, achieved by any other design method should also be included within the protection scope of the present disclosure.

The previous content is further detailed descriptions of the present disclosure in combination with the specific example embodiments, and the specific embodiments of the present disclosure are not limited to the descriptions. Several equivalent substitutions or obvious variations of the same performance or usage made by a person of ordinary skill in the art without departing from the concept of the present disclosure should all be included within the protection scope of the present disclosure.

What is claimed is:

1. A Vertical-Cavity Surface-Emitting Laser (VCSEL) array light source, comprising:

a semiconductor substrate; and a plurality of VCSEL light sources arranged on the semiconductor substrate in a two-dimensional array; wherein:

the two-dimensional array includes a first sub-array and a plurality of second sub-arrays, the first sub-array includes a plurality of VCSEL light sources that are arranged randomly, and a first one of the second sub-arrays disposed against a right boundary of the first sub-array is generated by transforming the first sub-array in a first transforming method, a second one of the second sub-arrays disposed against a lower boundary of the first sub-array is generated by transforming the first sub-array in a second transforming method different from the first transforming method.

2. The VCSEL array light source according to claim 1, wherein the first sub-array and the second sub-arrays are distributed within a regular region, an irregular region, or a combination of a regular region and an irregular region.

3. The VCSEL array light source according to claim 2, wherein the regular region includes a polygonal region or a circular region.

4. The VCSEL array light source according to claim 1, wherein the first transforming method is one of translating, rotating, mirroring, and scaling the first sub-array to generate the first one of the second sub-arrays, and the second transforming method is another one of translating, rotating, mirroring, and scaling the first sub-array to generate the second one of the second sub-arrays.

5. The VCSEL array light source according to claim 1, wherein two adjacent sub-arrays of the two-dimensional array are partially overlapping with each other, separated by a space without a VCSEL light source, or overlapping with each other at edges thereof.

6. The VCSEL array light source according to claim 1, wherein the first sub-array and each one of the second sub-arrays are different in at least one aspect of a size, a distribution shape, or a number of light sources.

7. The VCSEL array light source according to claim 1, wherein the semiconductor substrate includes a plurality of sub-substrates, and the sub-arrays are arranged on the plurality of sub-substrates respectively.

8. A pattern design method for a Vertical-Cavity Surface-Emitting Laser (VCSEL) array light source, comprising:

generating an irregularly arranged sub-array pattern that including light sources arranged irregularly; and generating a pattern of a two-dimensional array, wherein the pattern of a two-dimensional array includes a plurality of sub-array patterns and the irregularly arranged sub-array pattern, a first one of the sub-array patterns disposed against a right boundary of the irregularly arranged sub-array pattern is generated by transforming the irregularly arranged sub-array pattern in a first transforming method, and a second one of the sub-array patterns disposed against a lower boundary of the irregularly arranged sub-array pattern is generated by transforming the irregularly arranged sub-array pattern in a second transforming method different from the first transforming method.

9. A Vertical-Cavity Surface-Emitting Laser (VCSEL) array light source, comprising:

a semiconductor substrate; and a plurality of VCSEL light sources arranged on the semiconductor substrate in the form of a two-dimensional array; wherein:

the two-dimensional array includes a first sub-array and a plurality of second sub-arrays, the first sub-array includes a plurality of VCSEL light sources that are arranged randomly, and a first one of the second sub-arrays disposed against a right boundary of the first sub-array is generated by transforming first sub-array in a first transforming method, a second one of the second sub-arrays disposed against a lower boundary of the first sub-array is generated by transforming first sub-array in a second transforming method different from the first transforming method; and the first sub-array and each of the second sub-arrays are different in at least one aspect of a size, a distribution shape, or a number of light sources.

10. A laser projection apparatus, comprising:

the VCSEL array light source according to claim 1;

at least one lens configured to receive and converge a light beam emitted from the VCSEL array light source; and a speckle pattern generator configured to expand the converged light beam to emit a speckle pattern beam into a space; wherein the at least one lens includes a single lens or a microlens array; and the speckle pattern generator includes one or more of a microlens array, a diffractive optical element, or a grating.

11. A three-dimensional (3D) imaging device, comprising:

the laser projection apparatus according to claim 10, wherein the laser projection apparatus is configured to emit a structured light pattern beam into the space;

an image acquisition apparatus configured to collect a structured light image, wherein the structured light image is formed by irradiating the structured light pattern beam on a target object; and a processor configured to receive the structured light image and calculate a depth image of the target object according to a trigonometric principle.

12. The VCSEL array light source according to claim 1, wherein the first one of the second sub-arrays disposed against the right boundary of the first sub-array is generated by scaling the first sub-array, and the second one of the second sub-arrays disposed against the lower boundary of the first sub-array is generated by translating the first sub-array downward.

* * * * *